(12) United States Patent
Wescott

(10) Patent No.: US 6,983,441 B2
(45) Date of Patent: Jan. 3, 2006

(54) EMBEDDING A JTAG HOST CONTROLLER INTO AN FPGA DESIGN

(75) Inventor: Douglas Albert Wescott, Adamstown, MD (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 10/183,902

(22) Filed: Jun. 28, 2002

(65) Prior Publication Data

US 2004/0001432 A1 Jan. 1, 2004

(51) Int. Cl.
*H03K 19/00* (2006.01)
*G06F 17/50* (2006.01)
*G01R 31/28* (2006.01)

(52) U.S. Cl. ............... 716/17; 716/1; 716/4; 714/725; 326/16

(58) Field of Classification Search ............... 716/1, 716/4, 16, 17; 714/724, 725, 726, 727, 733; 326/16
See application file for complete search history.

(56) References Cited

U.S. PATENT DOCUMENTS

| 5,483,518 | A | * | 1/1996 | Whetsel ..................... 370/241 |
| 5,878,051 | A | | 3/1999 | Sharma et al. ............. 371/22.1 |
| 6,044,025 | A | | 3/2000 | Lawman ..................... 365/191 |
| 6,102,963 | A | * | 8/2000 | Agrawal ..................... 716/17 |
| 6,134,707 | A | * | 10/2000 | Herrmann et al. .......... 717/139 |
| 6,137,738 | A | | 10/2000 | Vorgert ...................... 365/201 |
| 6,184,708 | B1 | * | 2/2001 | Jenkins, IV ................ 326/39 |
| 6,243,842 | B1 | | 6/2001 | Slezak et al. ............... 714/724 |
| 6,279,146 | B1 | * | 8/2001 | Evans et al. ................ 716/18 |
| 6,615,402 | B2 | * | 9/2003 | Kaneko et al. ............. 716/16 |
| 2003/0099224 | A1 | * | 5/2003 | Oates ......................... 370/342 |

* cited by examiner

*Primary Examiner*—Leigh M. Garbowski
(74) *Attorney, Agent, or Firm*—Abdul Zindani; Wade James Brady, III; Frederick J. Telecky, Jr.

(57) ABSTRACT

A method for embedding a Joint Test Action Group (JTAG) standard IEEE 1149.1 host controller into a field programmable gate array (FPGA) for platform development and DSP programming, and boundary scan of targeted hardware using JTAG commands and architecture is described. The FPGA-based JTAG host controller is bussed directly into the FPGA core, bypassing the board's JTAG communication port.

12 Claims, 4 Drawing Sheets

EMBEDDING A JTAG HOST CONTROLLER INTO AN FPGA DESIGN

FIELD OF THE INVENTION

The present invention relates to using the Joint Test Action Group (JTAG) standard IEEE 1149.1 et seq. for platform development and boundary scan of targeted hardware using JTAG commands and architecture and a field programmable gate array (FPGA).

BACKGROUND OF THE INVENTION

There has been a dramatic increase in the complexity of electronic systems, as a result of advances in the integration of semiconductors, the introduction of new packaging techniques, and the consequent use of double-sided circuit boards. However, increased component density on circuit boards brings with it new problems of testability, since the number of the necessary test vectors increases out of proportion with complexity. Today's highly integrated multi-layer boards with fine-pitch ICs are virtually impossible to access physically for test. Traditional board test methods include functional test, which only accesses the board's primary I/Os, providing limited coverage and poor diagnostics for board-network faults. In-circuit test, another traditional test method, works by physically accessing each wire on the board via costly "bed of nails" probes and testers.

In 1985, leading electronic manufacturers founded the Joint Test Action Group (JTAG), in order to develop a new and cost-effective test concept. The result of this was the IEEE 1149.1 standard. This standard requires the use of special test-circuits at the inputs and outputs of selected semiconductor components, together with logic to control such test-circuits. A 4-wire serial test bus combines the test-circuits into a complete test-group, which is controlled via the test bus; in this way, with only 4 lines the complete system can be partitioned and tested. The control of an IEEE 1149.1-compatible test system is usually performed by a computer. For example, a test bus controller, such as the TEST BUS CONTROLLER (TBC) SN74ACT8990 from Texas Instruments, can be connected to a computer like a normal interface circuit, and it then controls completely the IEEE 1149.1 test bus. The computer first configures the TBC, and then loads in parallel the test commands and test vectors. The TBC transfers these commands and vectors to the system, and thereby generates the signal sequence required by IEEE 1149.1. The processor can read the result in parallel from the TBC, after the test data has addressed the logic to be tested. This Application Report describes the operation of the TBC, and explains the programming procedure with examples.

Boundary scan is a special type of scan path that consists of a series of test cells added at every I/O pin on a device. Although this requires the addition of a special test latch on some pins, the technique offers several important benefits. The most obvious benefit is allowing fault isolation at the component level. Such an isolation requirement is common in telecommunications switching environments where prompt field repair is critical. The resulting boundary-scan register and other test features of the device are accessed through a standard interface—the JTAG Test Access Port (TAP). At the device level, the JTAG TAP allows for access to standard chip internal test facilities such as internal scan path, Built-in Self Test (BIST), and built-in emulation and debug. The chip internal scan path involves the substitution of normal storage elements (latches and flip-flops) with scannable counterparts that can be serially interconnected for test purposes. BIST uses on-chip stimulus generators and response monitors to eliminate the need for test pattern generation. JTAG is ideally suited for boardlevel testing since the boundaryscan registers of compliant devices provide access to control and observe board-level nodes/networks. Naturally, with more devices on a board that include JTAG, test coverage and diagnostic facility are consequently improved. However, even where some devices on a board do not include JTAG, JTAG access to many nodes still can be used effectively in place of physical probes. Using JTAG at the system level allows for higher integration of the whole system. The standard TAP enables system hardware debug and hardware/software integration while chips and boards are still in their normal system configuration and operating environment. Furthermore, this built-in access can be reused in fielded systems for in-service test and maintenance. The obvious benefit offered by the boundary-scan technique is fault isolation at the printed circuit node/network level. This level of isolation is a common requirement in telecommunications switching or similar environments where prompt field repair is critical.

A major problem driving the development of IEEE Std 1149.1 boundary scan is the adverse effect of surface-mount technology. The inclusion of a boundary-scan path in surface-mount components, in many cases, affords the only way to perform continuity tests between devices. By placing a known value on an output buffer of one device and observing the input buffer of another interconnected device, it is easy to see if the printed wiring board (PWB) net is electrically connected. Failure of this simple test indicates broken circuit traces, cold solder joints, solder bridges, or electrostatic-discharge (ESD) induced failures in an IC buffer—all common problems on PWBs. A less-obvious advantage of the boundary-scan methodology is the ability to apply predeveloped functional pattern sets to the I/O pins of the IC by way of the scan path. IC manufacturers and ASIC developers create functional pattern sets for DC test purposes. Subsets of these patterns can be reused for in-circuit functional IC testing. Reusing existing patterns in the development of system diagnostics can save large amounts of development resources, especially if many of the ICs in a system have embedded boundary-scan paths. IEEE Std 1149.1 is a common protocol and boundary-scan architecture developed into an industrial standard after thousands of man hours of cooperative development by approximately 200 major international electronics firms. Early contributors in the development of IEEE Std 1149.1 recognized that only a nonproprietary architecture would encourage companies to offer the compatible integrated circuits, test equipment, and CAD software needed to bring product development, manufacturing, and test costs under control in today's competitive electronics marketplace. Many people believe that boundary-scan architecture will do for development, manufacturing, and test what the RS-232C standard did for computer peripherals.

FIG. 1 shows an IC 10 with an application-logic section 12 and related input and output, and a boundary-scan path consisting of a series of boundary-scan cells (BSCs) 14, in this case one BSC per IC function pin. The BSCs 14 are interconnected to form a scan path between the host IC's 10 test data input (TDI) pin 16 and test data output (TDO) pin 18. During normal IC operation, input and output signals pass freely through each BSC 14, from the normal data input (NDI) 20, to the normal data output (NDO) 22. However, when the boundary-test mode is entered, the IC's boundary is controlled in such a way that test stimulus can be shifted in and applied from each BSC output (NDO), and test response can be captured at each BSC input (NDI) 20 and shifted out for inspection. External testing of wiring interconnects and neighboring ICs on a board assembly is accomplished by applying test stimulus from the output BSCs and capturing test response at the input BSCs. As an option, internal testing of the application logic can be accomplished by applying test stimulus from the input BSCs and capturing test response at the output BSCs. The implementation of a scan path at the boundary of IC 10 designs provides an embedded testing capability that can overcome the physical access problems in current and future board designs.

The BSCs 14 are interconnected to form a scan path between the host IC's 10 test data input (TDI) 16 pin and test data output (TDO) pin 18. During normal IC operation, input and output signals pass freely through each BSC 14, from the normal data input (NDI) 20, to the normal data output (NDO) 22. However, when the boundary-test mode is entered, the IC's boundary is controlled in such a way that test stimulus can be shifted in and applied from each BSC output (NDO), and test response can be captured at each BSC input (NDI) and shifted out for inspection. External testing of wiring interconnects and neighboring ICs on a board assembly is accomplished by applying test stimulus from the output BSCs and capturing test response at the input BSCs. As an option, internal testing of the application logic can be accomplished by applying test stimulus from the input BSCs and capturing test response at the output BSCs. The implementation of a scan path at the boundary of IC designs provides an embedded testing capability that can overcome the physical access problems in current and future board designs.

FIG. 2 shows the IEEE Standard 1149.1 architecture. The architecture consists of an instruction register 24, a bypass register 25, a boundary-scan register 26, optional user data register(s)28, and a test interface referred to as the test access port (TAP) 30. In FIG. 2, the boundary-scan register (BSR) 26, a serially accessed data register made up of a series of BSCs 14, is shown at the input 30 and output boundary 32 of the IC 10. The instruction register and data registers are separate scan paths arranged between the primary test data input (TDI) 16 pin and primary test data output (TDO) 18 pin. This architecture allows the TAP 30 to select and shift data through one of the two types of scan paths, instruction or data, without accessing the other scan path. TAP 30 is controlled by the test clock (TCK) 36 and test mode select (TMS) 38 inputs. These two inputs determine whether an instruction register 25 scan or data register scan is performed. The TAP 30 consists of a small controller design, driven by the TCK input 36, which responds to the TMS input 38. The IEEE Std 1149.1 test bus uses both clock edges of TCK 36. TMS 38 and TDI 16 are sampled on the rising edge of TCK 38, while TDO 18 changes on the falling edge of TCK 36.

Originally, the JTAG standard was developed to perform boundary scan test procedures wherein the interconnections and IC device placement on printed circuit boards (PCBs) are tested through the connection pins of the PCBs, without the use of mechanical probes. Later implementations of JTAG have been extended to include additional test procedures such as device functional test, self-tests, diagnostics, and code development and debug on microprocessors such as digital signal processors (DSPs) and application specific integrated circuits (ASICs). Boundary scan has been modified to provide In-System Programming, whereby configuration data is transmitted into a target programmable device after the device is mounted onto a PCB.

Field programmable gate arrays (FPGAs) are a type of digital integrated circuit that may be programmed by a user to perform specific logic functions. An FPGA includes an array of configurable logic blocks surround by a ring of programmable input/output blocks. The blocks are interconnected by a programmable interconnect structure. The blocks and structure are programmed by loading configuration data via memory or written into the FPGA by an external device. Certain FPGAs support configuration via boundary scan, or JTAG. When JTAG configuration is used, the FPGA is also programmed with testing software as part of a sequence of test programs. A test sequence can be performed for loading a new configuration on the FPGA using the same software and circuit board connections. Both configuration and test are performed by the same tester software, and the circuit board connections need not be changed back and forth between configuration mode and test mode during the testing process.

SUMMARY OF THE INVENTION

The Joint Test Action Group (JTAG) standard IEEE 1149.1 et seq. is used for boundary scan tests and code development and debug of targeted hardware on a printed circuit board (PCB) through a field programmable gate array (FPGA). A typical hardware configuration for code development and debug on a digital signal processor (DSP) uses a personal computer that has a JTAG host controller in the form of an ISA card installed on the motherboard. The controller card is connected to a PCB via a JTAG emulator cable pod device having a serial communications cable connecting to the controller card and to the targeted PCB. Commands for code development are sent from the PC to the FPGA using code composer software.

The preferred embodiment embeds the functionality of a JTAG emulator pod and controller card inside of an FPGA. The memory array is bussed directly into the FPGA core, thereby bypassing the traditional PC card host controller. A communications driver in the FPGA receives instructions or programming code from an external computer, while JTAG host controls are stored and executed from the embedded memory array. The FPGA then sends programming commands or boundary scan instructions through a JTAG logic interface that is bussed to a DSP's or other targeted hardware's JTAG interface.

BRIEF DESCRIPTION OF THE DRAWINGS

Preferred embodiments of the invention are discussed hereinafter in reference to the drawings, in which.

DETAILED DESCRIPTION OF THE INVENTION

There is described herein a method and system for embedding a JTAG's host controller on the same printed circuit board (PCB) as the targeted field programmable gate array (FPGA) and digital signal processor (DSP) or other processing hardware. In the following description, numerous specific details are set forth to provide a more thorough understanding of the present invention. However, it will be apparent to one skilled in the art that the present invention may be practiced without these specific details.

Figure 1:
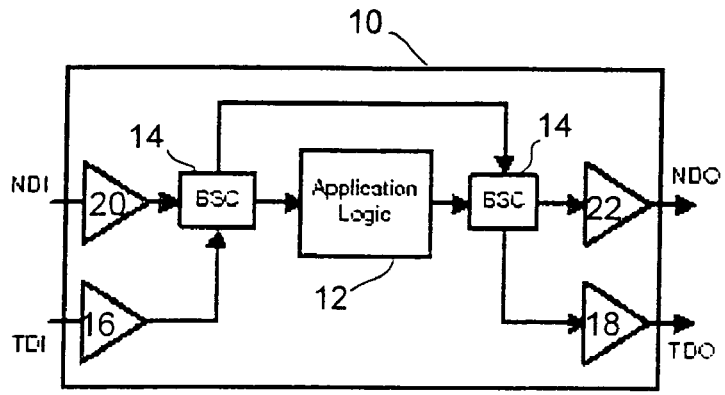
FIG. 1 is a prior art diagram of an integrated circuit and corresponding boundary scan paths.
Figure 2:
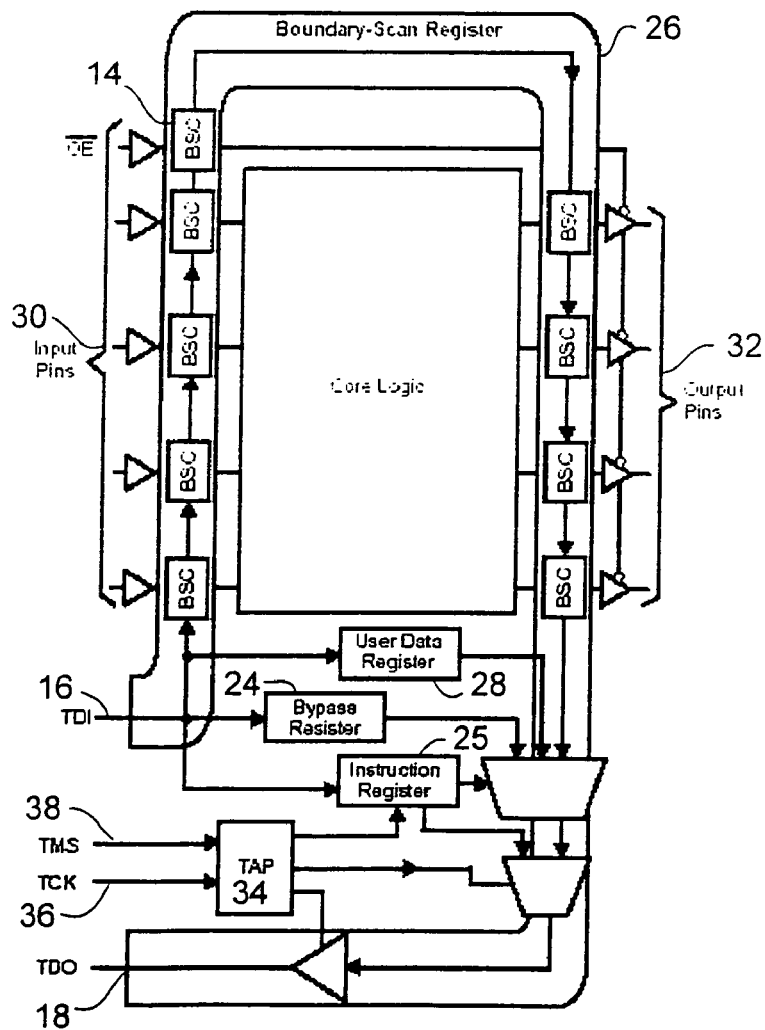
FIG. 2 is a prior art diagram of typical IEEE Standard 1149.1 architecture around a core.
Figure 3:
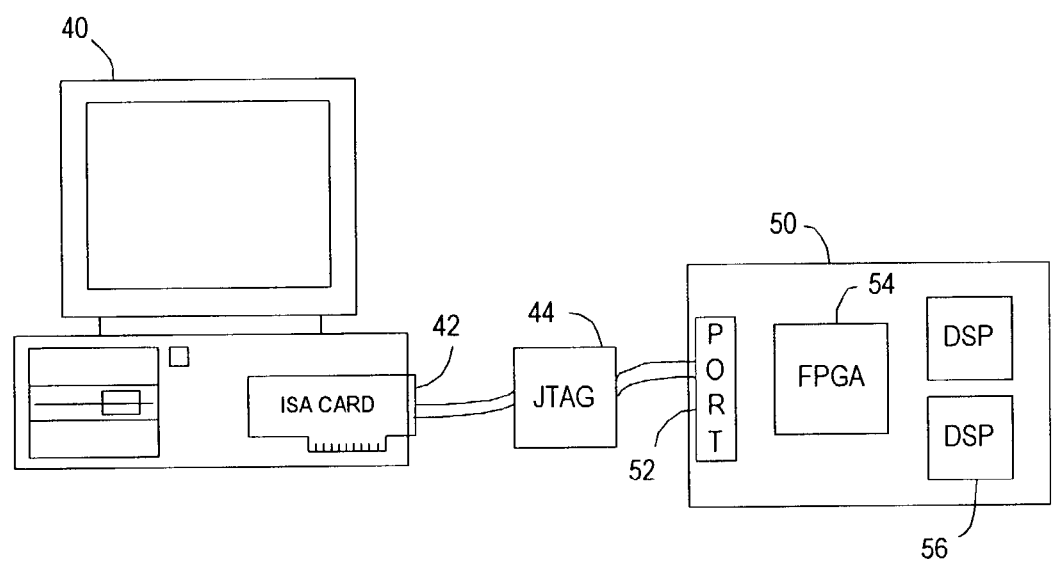
FIG. 3 is a typical system diagram for a JTAG host controller.

FIG. 3 illustrates a typical development hardware system configuration used for DSP code development and debugging operations. A computer 40, such as a personal computer, having a video output screen, hard drive, and operating system for operating software associated with JTAG boundary scans or code development also has a motherboard or backboard that receives a JTAG controller card 42 that is formatted to fit into an ISA slot. An example of a JTAG controller card 42 is a Texas Instruments XDS510 ISA card. A controller card 42 is connected to a JTAG emulator target cable 46, which consists of a section of jacketed cable, an active cable pod 44, and a shorter section of jacketed cable 48 that connects to the printed circuit board (PCB) 50 having targeted hardware. The cable pod box 44 is nonconductive plastic with four recessed metal screws. An example of a cable pod 44 is an XDS510 emulator cable pod from Texas Instruments. JTAG target device 50 supports emulation through a dedicated JTAG emulation test bus port 52 through which in-system programming occurs using a serial channel. Port 52 is a multi-pin communications port in accordance with the IEEE 1149.1 standard and is accessed by connection to emulator pod 44. For the JTAG emulation environment described in FIG. 3, each target platform requires the a JTAG controller card 42 and code composer software running on the PC 40.

Figure 4:
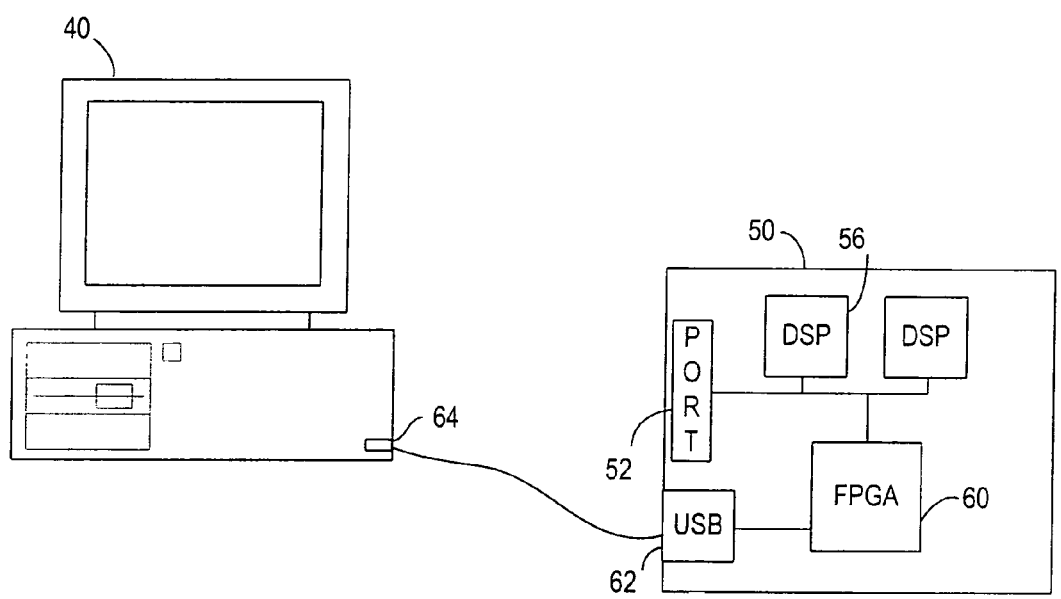
FIG. 4 is a diagram of the preferred embodiment for an embedded JTAG host controller.

FIG. 4 illustrates a preferred embodiment of the present invention wherein a JTAG host controller is embedded into an FPGA on the same PCB. JTAG emulator pod 44 and controller card 42 are replaced by using the resources of FPGA 60 to implement the functionality for interfacing to JTAG port 52. Source code is also provided for embedding the JTAG controller onto PCB 50. The present invention saves the end user thousands of dollars in equipment costs by avoiding the purchase of the JTAG emulation controller card 42 and cable pod 44 to perform JTAG configuration and testing of target hardware. In addition to removing JTAG hardware 44, FPGA JTAG controller 60 avoids the need to have a pronged JTAG port 52 located on the PCB 50, which assists with ISO 2000 compliance for the PCB.

In the configuration of the preferred embodiment, PC 40 communicates with FPGA-based host controller 60 via a PC communications interface. In the preferred embodiment, a universal serial bus (USB) port 62 is located on the PCB 50 and coupled to the communications bus for FPGA host controller 60. However, the communications interface is not limited to a USB port and interfaces such as USB 2.0, Firewire (1394), or Ethernet may be used with the preferred embodiment. USB port 62 is connected via a USB cable to USB port 64 on PC 40.

Figure 5:
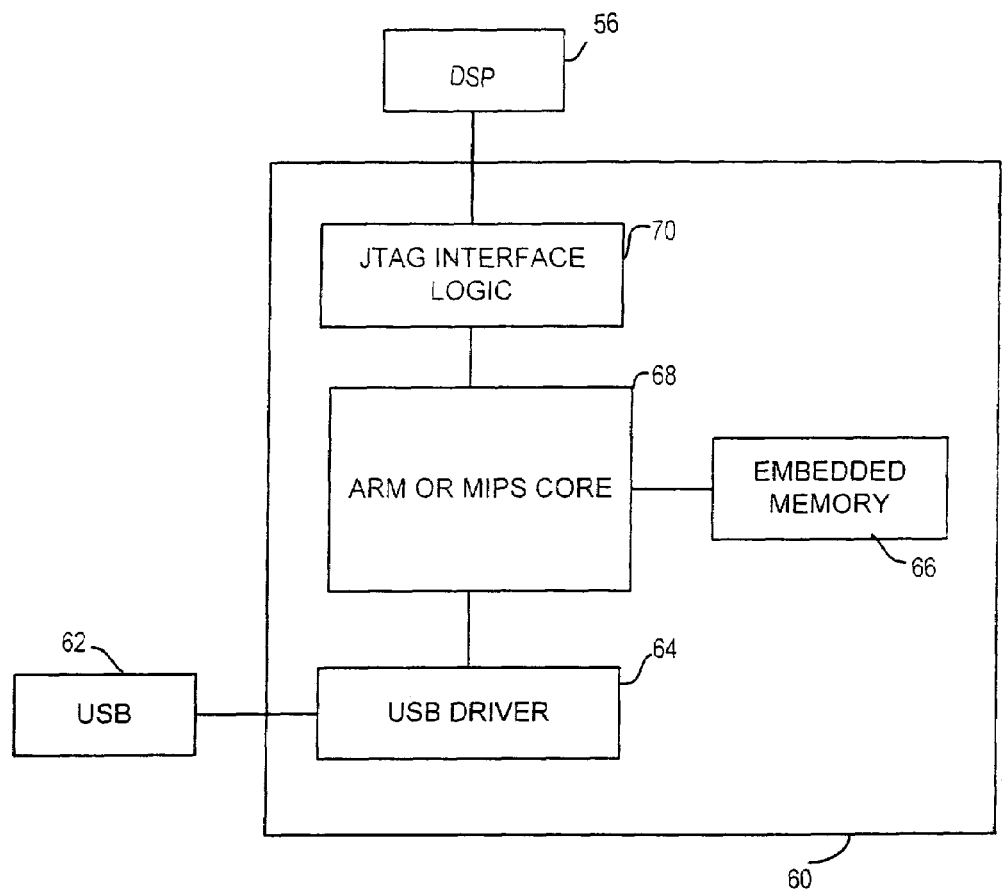
FIG. 5 is a diagram of the internal FPGA block in the embedded JTAG host controller.

An internal diagram of the preferred embodiment of an FPGA-host controller 60 is illustrated in FIG. 5. USB port 62 is connected to USB driver 64 via a USB serial cable. An embedded memory array 66 contains source code of JTAG instructions and logic, formerly held by an ISA controller card 42 in PC 40. FPGA 60 is therefore programmed with logic required by a JTAG controller without the use of an external controller. Embedded array 66 may include random access memory, read only memory, erasable programmable read only memory, or any other memory technology compatible with the FPGA 60. Embedded memory array 66 is bussed to the ARM or MIPS core 68 of FPGA 60. FPGA 60 then sends JTAG logic or programming commands from the ARM or MIPS core 68 through a JTAG logic interface 70 to DSPs 56 or other microprocessors. The memory array 66 may also serve as a data buffer for storing high-speed outputs from, for example, DSPs 56 to PC 40 for from PC 40 to a DSP 56.

Although the preferred embodiment described a single FPGA, other embodiments include multiple FPGAs for multiple chipsets on a PCB or other target hardware. Additionally, embedded FPGA 60 may be a replaceable chip located on the PCB. A high-density FPGA with JTAG functionality can be used temporarily for coding or testing of target hardware and DSPs on a PCB and then once coding and/or testing is completed, replaced with a less expensive FPGA chip without JTAG functionality for mass production of the PCB.

A method for practicing the preferred embodiment includes configuring a field programmable gate array (FPGA) to communicate with a target hardware device using JTAG architecture. As illustrated in FIG. 6, the method includes forming an embedded JTAG host controller on a printed circuit board by placing an FPGA on a printed circuit board 74, a memory array embedded in the FPGA 76, communicating JTAG instructions to JTAG ports of target hardware through a JTAG logic interface in the FPGA 78, and interfacing with a communications bus from an external computer via a communications driver in the FPGA 80. The memory array is one of the following: random access memory, read only memory, a first-in first-out buffer, an adder, a multiplier, an application specific integrated circuit, or any functionality having a known input-output transfer function. The step of interfacing with a communications bus uses the JTAG logic interface which receives program commands from software on an external computer. Further, the memory array buffers output data sent between the targeted hardware and an external computer. Additionally, the targeted hardware is one of the following: a digital signal processor, an application specific integrated circuit, or an integrated circuit.

By providing the FPGA source code for embedding the JTAG host controller into each platform, the present invention has the advantages of providing end users greater access to developing and debugging systems because equipment costs decrease dramatically; the end user can create a "closed box" development system whereby the system is developed and debugged in a static safe environment; schools and universities can afford DSP development platforms due to the lower equipment costs; compatibility with existing and future FPGAs if open-source coding is used for the embedded FPGA controller.

Because many varying and different embodiments may be made within the scope of the inventive concept herein taught, and because many modifications may be made in the embodiments herein detailed in accordance with the descriptive requirements of the law, it is to be understood that the details herein are to be interpreted as illustrative and not in a limiting sense. Rather, the scope of the invention is defined by the claims that follow:

What is claimed is:

1. A system for configuring a field programmable gate array (FPGA) as a peripheral Joint Test Access Group (JTAG) host controller for a peripheral hardware target, comprising:

a processor that includes source code for a JTAG host controller;

an FPGA attached to a peripheral printed circuit board, the FPGA including:

a memory array that is programmed with the source code for the JTAG host controller, by the external processor;
a processor core; and
JTAG interface logic;
a serial connector that connects the processor to the FPGA; and
a hardware target that is JTAG-compliant and attached to the peripheral printed circuit board;
wherein the FPGA sends JTAG host controller signals through the JTAG interface logic to the hardware target.

2. The system of claim 1, wherein the memory array includes at least one of a random access memory, a read only memory, an erasable programmable read only memory, and a first-in first-out buffer.

3. The system of claim 1, wherein the FPGA is removable from the printed circuit board.

4. The system of claim 1, wherein the hardware target includes one of a digital signal processor, an application specific integrated circuit, and an integrated circuit.

5. The system of claim 1, wherein JTAG host controller signals are sent from the FPGA to the target hardware without use of a controller that is external to the peripheral printed circuit board.

6. The system of claim 1, wherein the serial connector comprises one of a Universal Serial Bus (USB) connector, a Firewall (1394) connector, and an Ethernet connector.

7. A method for configuring a field programmable gate array (FPGA) as a peripheral Joint Test Access Group (JTAG) host controller for a peripheral hardware target, comprising:

programming the FPGA on a peripheral printed circuit board to include:
a memory array;
a processor core; and
JTAG interface logic;
loading the memory array of the FPGA with source code of a JTAG host controller from an external processor through a serial connector; and
communicating JTAG signals through the JTAG interface logic to the hardware target that is JTAG-compliant and is located on the peripheral printed circuit board.

8. The method of claim 7, wherein the memory array includes one of a random access memory, a read only memory, an erasable programmable read only memory, and a first-in first-out buffer.

9. The method of claim 7, wherein the memory array includes buffers for buffering data sent to the hardware target and for buffering data received from the external processor.

10. The method of claim 7, wherein the target hardware comprises one of a digital signal processor, an application specific integrated circuit, and an integrated circuit.

11. The method of claim 7, wherein JTAG signals are sent by the FPGA to the hardware target without use of a controller that is external to the peripheral printed circuit board.

12. The method of claim 7, wherein the serial connector comprises one of a Universal Serial Bus (USB) connector, a Firewall (1394) connector, and an Ethernet connector.

* * * * *